(12) United States Patent
Wiechowski et al.

(10) Patent No.: US 10,394,704 B2
(45) Date of Patent: Aug. 27, 2019

(54) METHOD AND DEVICE FOR TESTING A SOFTWARE PROGRAM

(71) Applicant: Ford Global Technologies, LLC, Dearborn, MI (US)

(72) Inventors: Norbert Wiechowski, Aachen (DE); Norman Hansen, Aachen (DE); Alexander Kugler, Aachen (DE); Stefan Kowalewski, Aachen (DE); Thomas Rambow, Aachen (DE); Rainer Busch, Aachen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 35 days.

(21) Appl. No.: 15/727,005

(22) Filed: Oct. 6, 2017

(65) Prior Publication Data

US 2018/0101472 A1    Apr. 12, 2018

(30) Foreign Application Priority Data

Oct. 7, 2016    (DE) .................. 10 2016 219 550

(51) Int. Cl.
| | |
|---|---|
| *G06F 11/36* | (2006.01) |
| *G06F 17/27* | (2006.01) |
| *G06F 17/50* | (2006.01) |
| *G01M 17/00* | (2006.01) |

(52) U.S. Cl.
CPC ......... *G06F 11/3692* (2013.01); *G01M 17/00* (2013.01); *G06F 11/3664* (2013.01); *G06F 17/271* (2013.01); *G06F 17/2785* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 5,684,713 A | 11/1997 | Asada et al. | |
| 6,539,534 B1 * | 3/2003 | Bennett | G06F 17/5054 716/102 |
| 7,331,007 B2 * | 2/2008 | Fine | G01R 31/318357 703/13 |
| 7,412,623 B1 * | 8/2008 | Lindberg | G06F 11/3414 714/33 |
| 7,523,441 B2 * | 4/2009 | Petersen | G06F 8/34 717/113 |
| 7,561,997 B1 * | 7/2009 | Miller | G01V 11/00 367/81 |
| 8,346,526 B1 * | 1/2013 | Portal | G06F 17/5009 703/13 |
| 8,732,663 B2 * | 5/2014 | Nagata | G06F 11/3688 717/124 |

(Continued)

FOREIGN PATENT DOCUMENTS

DE    10303489    8/2004

*Primary Examiner* — Isaac T Tecklu
(74) *Attorney, Agent, or Firm* — Burris Law, PLLC

(57) ABSTRACT

The present disclosure relates to a method and a device for testing a software program. The method of the present disclosure simulates, in a simulation process, a predetermined scenario on a test platform in a test scenario. The test platform in this simulation process generates output values based on input stimuli, and a dynamic adaption of the test scenario takes place during the simulation process based on the current state of the simulation process.

17 Claims, 2 Drawing Sheets

(56) References Cited

U.S. PATENT DOCUMENTS

Figure 1:
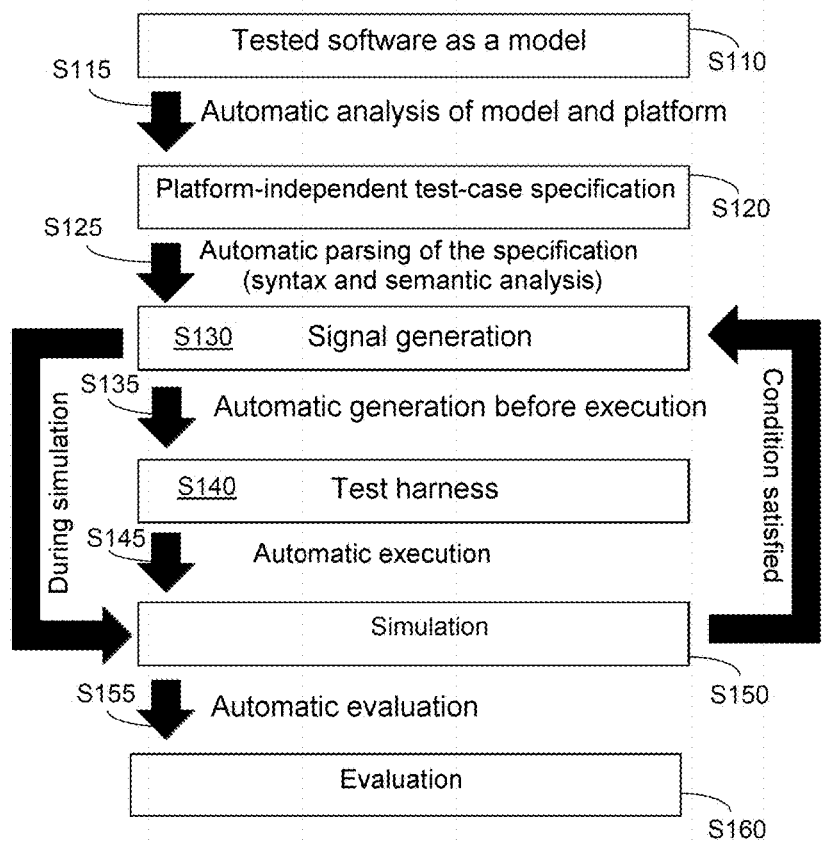

| | | | | |
|---|---|---|---|---|
| 9,501,390 B1* | 11/2016 | Chellappa | | G06F 11/3692 |
| 9,747,187 B2* | 8/2017 | Fink | | G06F 21/577 |
| 2002/0193979 A1* | 12/2002 | Paterson | | G06F 9/44505 |
| | | | | 703/22 |
| 2003/0069010 A1* | 4/2003 | Eravelli | | H04W 24/00 |
| | | | | 455/423 |
| 2005/0096861 A1* | 5/2005 | Ur | | G06F 17/5022 |
| | | | | 702/109 |
| 2006/0212540 A1* | 9/2006 | Chon | | G06F 11/261 |
| | | | | 709/218 |
| 2007/0011631 A1* | 1/2007 | Fine | | G01R 31/318357 |
| | | | | 716/105 |
| 2007/0021954 A1* | 1/2007 | El-Damhougy | | G06F 13/387 |
| | | | | 703/21 |
| 2007/0168744 A1* | 7/2007 | Pal | | G06F 11/3688 |
| | | | | 714/38.1 |
| 2007/0260373 A1* | 11/2007 | Langer | | G01M 17/007 |
| | | | | 701/31.4 |
| 2007/0260438 A1* | 11/2007 | Langer | | G01M 17/007 |
| | | | | 703/8 |
| 2008/0270090 A1* | 10/2008 | Bracker | | G05F 1/625 |
| | | | | 703/4 |
| 2009/0265156 A1* | 10/2009 | Taillefer | | G06F 9/45504 |
| | | | | 703/21 |
| 2010/0030539 A1* | 2/2010 | Chandhoke | | G05B 17/02 |
| | | | | 703/7 |
| 2010/0198799 A1* | 8/2010 | Krishnan | | G06F 11/3696 |
| | | | | 707/702 |
| 2010/0223038 A1* | 9/2010 | Groen | | G09B 9/00 |
| | | | | 703/2 |
| 2011/0227556 A1* | 9/2011 | Ivchenko | | G01C 25/005 |
| | | | | 323/318 |
| 2011/0288841 A1* | 11/2011 | Larsson | | G05B 17/02 |
| | | | | 703/8 |
| 2013/0096901 A1* | 4/2013 | Gellerich | | G06F 17/5022 |
| | | | | 703/13 |
| 2013/0166271 A1* | 6/2013 | Danielsson | | G06F 11/3664 |
| | | | | 703/22 |
| 2013/0311032 A1* | 11/2013 | Shelcusky | | G07C 5/008 |
| | | | | 701/29.1 |
| 2013/0311827 A1* | 11/2013 | Drory | | G06F 11/3664 |
| | | | | 714/32 |
| 2014/0012479 A1* | 1/2014 | Zhao | | B60K 31/0008 |
| | | | | 701/96 |
| 2014/0019942 A1* | 1/2014 | Suevern | | G06F 11/3664 |
| | | | | 717/124 |
| 2014/0343915 A1* | 11/2014 | Song | | H04L 41/145 |
| | | | | 703/13 |
| 2015/0309920 A1* | 10/2015 | Ishigooka | | G06F 11/3688 |
| | | | | 717/126 |
| 2016/0293133 A1* | 10/2016 | Dutt | | G06F 8/20 |
| 2017/0091351 A1* | 3/2017 | Namer | | G06F 17/5022 |

* cited by examiner

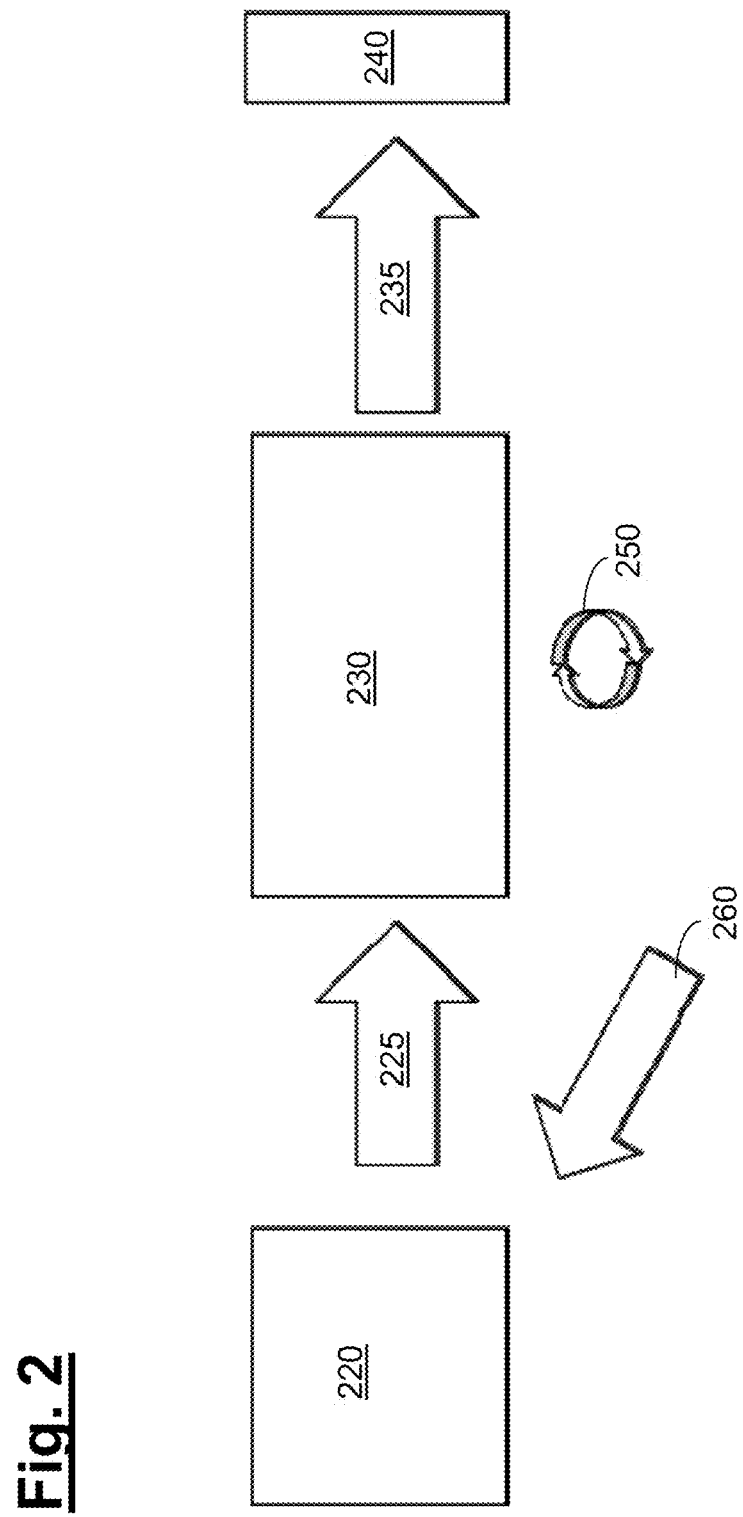

METHOD AND DEVICE FOR TESTING A SOFTWARE PROGRAM

CROSS-REFERENCE TO RELATED APPLICATIONS

This application claims priority to and the benefit of DE 102016219550.6 filed on Oct. 7, 2016. The disclosure of the above application is incorporated herein by reference.

FIELD

The present disclosure relates to a method and a device for testing a software program, in particular a program for signal processing, such as control applications in automobiles.

BACKGROUND

The statements in this section merely provide background information related to the present disclosure and may not constitute prior art.

In the automobile field, embedded software applications are frequently developed as a function of, or on the basis of, physical and logical signal values (e.g., accelerator pedal positions and other information signals). To test the respective software applications, meaningful sequences for these signals should be defined to execute the software application while using the signals concerned, and to evaluate or to assess the output values generated.

One exemplary scenario, can take a form in which, by actuating the accelerator pedal, a vehicle is accelerated up to a predetermined speed, and the accelerator pedal is released after reaching this speed. A simulation model can be used to describe the vehicle with corresponding interfaces for influencing the accelerator pedal.

One issue that can occur is that the specification of signals that should be similar to those that actually arise in the real world is time-consuming and liable to error. As a result, this step is often neglected until the software application is integrated into the embedded hardware. A reaction to the signals calculated during the execution of the software application concerned, and their change, is possible without making a change to the software application itself, as long as the signals are not internal signals. However, if the internal signals or variables needs to be changed while executing a test case, the software has to be changed, which can in turn result in unwanted side effects if the changes concerned are not removed again before the relevant code generation.

For example purposes only, such teachings are provided in U.S. Pat. No. 7,523,441 B2, European Patent No. 1,898,282 A1 and U.S. Pat. No. 6,539,534 B1.

SUMMARY

It is an object of the present disclosure to provide a method and a device for testing a software program which permits application, as early as the development process, with the highest possible level of automation.

In an aspect of the present disclosure, a method for testing a software program is provided. In a simulation process, a predetermined scenario is simulated on a test platform in a test scenario. The test platform, in this simulation process, generates output values based on input stimuli. A dynamic adaption of the test scenario takes place during the simulation process based on the current state of the simulation process.

The method according to the present disclosure makes it possible, in particular, to interact with the respective test platform during a simulation process, or to enter into data exchange with It, and thus to react to events during the simulation. Stimulation signals of the respective scenario can be changed here, and values that were generated by the test platform itself during the simulation can also be overwritten, inasmuch as this is specified and desirable in the scenario concerned.

Both the current state of the simulation and also the output values generated up to the respective point in time by the test platform are taken into account in the automated change of the stimulation signals ("stimuli"), and new stimuli, along with output values for the currently running simulation, are generated on this basis. These stimuli comprise both those that directly relate to the inputs of the system to be tested as well as signal values that are generated by the test platform within the system to be tested. Altogether, an entirely automated test process is realized here.

The method according to the present disclosure makes it possible to take the current system state, at a predetermined point in time or depending on events occurring during the simulation, into account, and to use corresponding values describing this system state to dynamically adjust the stimulation signals ("stimuli") and reference values.

Altogether, an efficient method is provided by the present disclosure for testing a simulation process, which in a simple manner permits the specification of signals, as well as acceptance or tolerance criteria, with the ability at the same time to use internal signals (i.e. generated or calculated during execution of the software). As a result, an automation of the process concerned and its application during the development process are enabled.

The present disclosure further includes the provision of a domain-specific language for the description of signals, which is similar to natural language, so that arbitrary, complex signals can be described, independently of the respective platform of the software execution. The implementation according to the present disclosure, thus, combines the functionalities of the analysis of the platform for software execution, the provision of an input facility for signal specification, and the automation of the entire process consisting of the input of stimulation signals, execution and evaluation. An advantage of this approach is that the corresponding signal specifications can be generated and held available universally for different software environments and programming languages (assembler, intermediate code, high-level language).

An important advantage of the method according to the present disclosure is the utilization of internal signals of a piece of software (i.e. the use of signals that have been calculated during the software execution), and the usability of these signals for reaction to previously specified conditions or states ("reactive testing") for changing the input stimulation signals during the simulation on the basis of these conditions or states. The corresponding values can, in addition, be used for recalculating the stimulation values and the acceptance or tolerance criteria. This can be achieved in that the execution of the software application is interrupted, a communication takes place with the device according to the invention, the signals are recalculated, the signals are then sent to the platform for software execution, and a changeover is made to the recalculated signals before the simulation is continued.

Further embodiments of the present disclosure are to be found in the description and in the subsidiary claims.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 1 is a flow chart of a routine in accordance with the teaching of the present disclosure; and FIG. 2 is a block diagram in accordance with the teaching of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a flow diagram to explain the possible flow of a method according to the present disclosure.

To test a piece of software, signals that are used to stimulate the inputs to the software during execution are determined. During the simulation, the corresponding output signals are recorded and evaluated, in that the recorded values are compared with previously specified acceptance or tolerance criteria.

A specification of the test case (i.e., "platform-independent test-case" in S120) is subjected to parsing, or to a syntax and semantics analysis (S125), and compiled into signals (S130). Prior to parsing, the software in the test (i.e., "tested software as a model" in S110) and the execution platform (i.e., test platform) are analyzed in order to identify the interface to the software and to use platform-specific variables (S115). From S130, a test harness is generated automatically based on the software interface (S135 and S140). This test harness represents a copy of or a reference to the original software that is extended or supplemented by specific elements which enable the stimulation of the inputs, the recording of the output values, and the manipulation of the internal signals. That is, the test harness may be a reference to the original software or the original software itself enriched with additional components to control the test execution as well as the test evaluation. The test is carried out automatically (S145, S150) on that basis. As soon as appropriate conditions are satisfied, the execution is interrupted if necessary, and the current status of the software variables is sent to the device according to the present disclosure. The signals are generated again based on the status of the software variables, and sent back to the execution platform. The test harness thus has a dynamic character over the course of the test.

After the test has finished running, a check is made as to whether the acceptance criteria are satisfied, and the recorded output values are automatically evaluated (S155, S160). In other words, predetermined parameters and quality criteria are output and stored.

In an exemplary implementation, a test specification can comprise the following parameters:

Inputs:
<input_signal1> [0]
Outputs:
<output_signal1> [0] (ON;–0.1;0.1;1;.5;0.1;0.001;0)
Calibration 1:
Calibration 2:
Constants:
Continuous signal changes:
Test:
Step 1:
Step 2:
Acceptance:
Criterion 1:
Criterion 2:

The "Inputs" section describes the fundamental attributes of the stimuli for each input. The "Output" section describes reference signals, including the attributes, for the evaluation. The "Calibrations" describe a change to a local parameter in the course of the test, thus permitting the convenient execution of the test with different parameters. If, for example, two calibratable parameters are provided, two simulation results are provided, each with changed parameters.

The input signals that are to be provided are described in the "Step" section. Each "Step" section is assigned a "Criterion". The conditions of the criterion are checked for as long as the corresponding "Step" continues. A wide variety of action commands are available for influencing the signal values and their development over time, e.g.:

<signal1> ramps to [5.0] in {2.0} seconds
<signal2> set to [TRUE]
wait for {8.0} seconds A test case of this sort is parsed, and compiled into corresponding commands for generating or simulating the signal values in the software that is to be tested. The software to be tested and its execution platform are first examined here in order to detect the software interfaces and to utilize platform-specific variables. The system can thus adapt automatically to different software environments or execution platforms, provided the corresponding syntax of the programming language or of the command structures is known.

A test harness is generated automatically based on this. The test harness provides a copy of the original software, with added instructions (in principle so-called debugging instructions) to enable the input stimulation, the recording of the output values, and the manipulation of internal signals.

The test harness is then executed. As soon as predetermined conditions are satisfied, the execution is halted if necessary, the current status of the software variables is sent to the test tool. The signals are generated again based on the status of the software variables, and sent back to the execution platform. Provided tests of signal processing (e.g., real-time signal processing) are involved, and the execution time is preferably halted for the duration of the predetermined modification of the test environment, so that the test process is not changed in time by the intervention of the test system.

A corresponding criterion can, for example, state:
If ["condition" ] during ("time") seconds then ("commands for changing the input stimulations")

Any logical expression able to be evaluated can be used as a condition, for example, signal >5. The above-described pseudo-programming language is designed to give the user the greatest possible freedom for definitions in ordinary language, for example, using alternative keywords (e.g., instead of using "If" for condition constructions, the term "Provided" can be used).

The specification of the time is optional. If this is present, the condition is checked for the specified time duration. If there is no time statement, the condition is only checked once, at the respective point in time of the simulation.

According to the following exemplary specification, the condition is checked once after 1 second.

Wait for {1} second

If ["condition"] ("commands for changing the input stimulations")

If "condition" is not satisfied, the commands inside the IF-block are not executed.

If "condition" is satisfied, the execution of the conditional block is continued for as long as is necessary for execution of the commands for changing the input stimulations.

It is also possible to overwrite or modify ("Overwrite") software variables for the values that are generated during the execution. This allows the tester a deeper interaction with the software to be tested and the simulated values, in particular in respect of checking conditions. For example, it is possible to wait for a particular event and then, by overwriting the correct values with deliberately incorrect values, to simulate a fault function. With this it is possible, for example, to simulate a failure of specific components and sensors, and this can be done dynamically, for example during markedly transient states of the system to be tested. The overwriting of values can also be ended at any time under the control of conditions:

Overwrite <signal1> on

Overwrite <signal1> off

The reactive actions can be used, both in the test section as well as in the acceptance criteria, for changing the simulation parameters and also the acceptance criteria, on the basis of the specified conditions.

FIG. 2 illustrates an aspect of the test method according to the present disclosure, namely the dynamic adaption of the test harness. A test tool 220 gives signals 225 to a software to be tested, or to a test harness 230. As the test is executed, predetermined conditions are checked regularly (at each timestamp) in 250, and when the conditions are satisfied, a new generation of the signals (arrow 260) is triggered. The output signals are transferred in 235 to a data memory 240, where they are stored for evaluation.

The step of the new generation of the signals by the test application during the test can be implemented in various ways, depending on the complexity of the conditions. For example, specific numeric parameters are adjusted in the existing test harness, or specific, alternative debugging blocks, already present in the test harness, are selected. As a result of the dynamic adaptability of the test, the test process can turn out quite differently, depending on the reaction of the program to be tested, which increases the informative value of the test.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for testing a software program, the method comprising:
    generating a test harness based on a software interface of the software program, wherein the test harness includes a copy of the software program and the test harness is configured to enable one or more input stimuli, record output values, and change one or more internal signals;
    executing, during a simulation process, the test harness to simulate a predetermined scenario on a test platform in a test scenario; and
    generating output values from the test platform in the simulation process based on input stimuli, wherein a dynamic adaption of the test scenario takes place during the simulation process based on the current state of the simulation process.

2. The method of claim 1, further comprising changing the input stimuli during the simulation process based on the output values generated during the dynamic adaption of the test scenario.

3. The method of claim 1 further comprising overwriting one or more output values generated by the test platform during the dynamic adaption of the test scenario.

4. A device for testing a software program in accordance with the method of claim 1, wherein, in a simulation process, a predetermined scenario is simulated on a test platform in a test scenario, and wherein the test platform in this simulation process generates output values based on input stimuli.

5. The method of claim 1 further comprising overwriting, during the dynamic adaption of the test scenario, the input stimuli to incorrect values to simulate a fault function.

6. The method of claim 1 further comprising stopping the dynamic adaption of the test scenario when a predetermined condition is satisfied.

7. A method for testing a software program, the method comprising:
    compiling commands to simulate signal values in the software program;
    generating a test harness based on a software interface of the software program, wherein the test harness includes a copy of the software program, the test harness is configured to enable one or more input stimulates, record output values, and change one or more internal signals;
    executing the test harness to simulate a predetermined scenario based on the input stimulates;
    generating output values based on the input stimulates; and
    ending the execution of the test harness when a predetermined condition is met.

8. The method of claim 7, wherein the compiling commands further includes parsing a test specification using syntax and semantic analyses.

9. The method of claim 8, wherein the test specification includes an input section that defines attributes of each of the one or more input stimulates, and an output section that defines attributes of the predetermined conditions.

10. The method of claim 9, wherein the test specification defines one or more criteria for each of the one or more input stimulates, and the one or more criteria is evaluated when the corresponding input stimulate is being applied.

11. The method of claim 7 further comprising overwriting at least one of the one or more input stimulates with incorrect values to simulate a fault function.

12. The method of claim 7 further comprising identifying an interface of the software program based on the software program and on an execution platform.

13. The method of claim 7 further comprising changing at least one of the one or more input stimulates during the simulation based on the output values generated.

14. A method for testing a software program, the method comprising:
    generating a test harness based on a software interface of the software program, wherein the test harness includes a copy of the software program and the test harness is configured to enable one or more input stimulates, record output values, and change one or more internal signals;

executing, during a simulation process, the test harness to simulate a predetermined scenario on a test platform in a test scenario;

generating output values from the test platform during the simulation process based on one or more input stimulates;

changing at least one of the one or more input stimulates during the simulation process based on the output values; and ending the simulation process when a predetermined condition is met.

15. The method of claim 14 further comprising overwriting at least one of the one or more input stimulates to incorrect values to simulate a fault function.

16. The method of claim 14 further comprising identifying an interface of the software program based on the software program and on the test platform prior to the simulation process.

17. The method of claim 14, wherein the predetermined condition is based on a preset time period.

* * * * *